(12) United States Patent
Kim et al.

(10) Patent No.: US 7,884,647 B2
(45) Date of Patent: Feb. 8, 2011

(54) OUTPUT DRIVER

(75) Inventors: Kyung-Hoon Kim, Gyeonggi-do (KR);
Dae-Han Kwon, Gyeonggi-do (KR);
Taek-Sang Song, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 0 days.

(21) Appl. No.: 12/326,990

(22) Filed: Dec. 3, 2008

(65) Prior Publication Data

US 2009/0302891 A1    Dec. 10, 2009

(30) Foreign Application Priority Data

Jun. 4, 2008    (KR) .................... 10-2008-0052744

(51) Int. Cl.
*H03K 19/0175* (2006.01)
(52) U.S. Cl. ............................ 326/82; 326/17; 327/108
(58) Field of Classification Search .................. 326/17,
326/21, 27, 29, 82, 83, 87; 327/108, 111
See application file for complete search history.

(56) References Cited

U.S. PATENT DOCUMENTS

| 5,293,082 | A | * | 3/1994 | Bathaee | 327/108 |
| 5,319,258 | A | * | 6/1994 | Ruetz | 326/21 |
| 5,654,648 | A | * | 8/1997 | Medhekar et al. | 326/17 |
| 5,963,047 | A | * | 10/1999 | Kwong et al. | 326/27 |
| 6,130,563 | A | * | 10/2000 | Pilling et al. | 327/111 |
| 6,608,505 | B2 | * | 8/2003 | Tsuji | 327/108 |
| 7,053,679 | B2 | | 5/2006 | Rho | |
| 7,151,392 | B2 | | 12/2006 | Lee | |
| 7,236,012 | B2 | | 6/2007 | Cho et al. | |
| 7,518,395 | B1 | * | 4/2009 | Chen et al. | 326/29 |
| 7,545,164 | B2 | * | 6/2009 | Song et al. | 326/30 |
| 2006/0158224 | A1 | | 7/2006 | Yan-Bin | |
| 2007/0008006 | A1 | | 1/2007 | Na | |
| 2007/0057691 | A1 | | 3/2007 | Lee | |

FOREIGN PATENT DOCUMENTS

| JP | 2006-246425 | 9/2006 |
| JP | 2007-097136 | 4/2007 |
| JP | 2007-097142 | 4/2007 |
| JP | 2007-166603 | 6/2007 |
| KR | 1020060096696 A | 9/2006 |
| KR | 1020070070989 A | 7/2007 |

OTHER PUBLICATIONS

Notice of Preliminary Rejection issued from Korean Intellectual Property Office on Oct. 30, 2009.
Notice of Allowance issued from Korean Intellectual Property Office on Jan. 7, 2010.

* cited by examiner

*Primary Examiner*—Rexford N Barnie
*Assistant Examiner*—Crystal L Hammond
(74) *Attorney, Agent, or Firm*—IP & T Group LLC

(57) ABSTRACT

There is provided an output driver, which includes a pre-driver configured to generate a main driving control signal in response to a data signal, a main driver configured to drive an output terminal in response to the main driving control signal, an auxiliary driving control signal generator configured to generate an auxiliary driving control signal having an activation interval corresponding to the data signal and an interval control signal, and an auxiliary driver configured to drive the output terminal in response to the auxiliary driving control signal.

20 Claims, 5 Drawing Sheets

OUTPUT DRIVER

CROSS-REFERENCE TO RELATED APPLICATION

This application claims priority of Korean patent application number 2008-0052744, filed on Jun. 4, 2008, which is incorporated by reference in its entirety.

BACKGROUND OF THE INVENTION

The subject matter relates to a semiconductor design, and more particularly, to an output driver capable of ensuring the integrity of output data by controlling a slew rate of the output data.

Generally, a semiconductor memory device including double data rate synchronous DRAM (DDR SDRAM) outputs data to the outside using an internal clock signal synchronized with an external clock signal. In the semiconductor memory device, the data is synchronized with a rising edge and a falling edge of the external clock signal. Accordingly, an output driver is required in the semiconductor memory device in order to receive the internal clock signal and output data corresponding to the external clock signal.

FIG. 1 is a circuit diagram illustrating a conventional output driver.

Referring to FIG. 1, the output driver includes a pull-up pre-driving unit 110, a pull-up metal option unit 120, a pull-up main driving unit 130, a pull-down pre-driving unit 140, a pull-down metal option unit 150, and the pull-down main driving unit 160.

The pull-up pre-driving unit 110 generates the pull-up driving control signal CTR_PU in response to a pull-up data signal DAT_PU, and includes a PMOS transistor and an NMOS transistor which are series-connected between an external voltage terminal VDD and a ground voltage terminal VSS, and each receive the pull-up data signal DAT_PU through their respective gates.

The pull-up metal option unit 120 generates a desired signal by changing the pull-up driving control signal CTR_PU having a possibility of skew in accordance with process, voltage and temperature (PVT), and includes a first resistance R1 and a first switch SW1 parallel-connected between the pull-up pre-driving unit 110 and the pull-up main driving unit 130. Therefore, the skew, which may occur in the pull-up driving control signal CTR_PU, is changed using a metal option mask.

The pull-up main driving unit 130 performs a pull-up operation on the output terminal DOUT in response to the output signal of the pull-up metal option unit 120, and includes a PMOS transistor having a source and a drain connected between the external voltage terminal VDD and the output terminal DOUT, and a gate receiving an output signal of the pull-up metal option unit 120.

The pull-down pre-driving unit 140 generates a pull-down driving control signal CTR_PD in response to a pull-down data signal DAT_PD, and includes a PMOS transistor and an NMOS transistor which are series-connected between an external voltage terminal VDD and a ground voltage terminal VSS, and have gates receiving the pull-down data signal DAT_PD.

Similar to the pull-up metal option unit 120, the pull-down metal option unit 150 generates a desired signal by changing skew of the pull-down driving control signal CTR_PD using a metal option mask, and includes a second resistance R2 and a second switch SW2 parallel-connected between the pull-down pre-driving unit 140 and the pull-down main driving unit 160. Therefore, the skew, which may occur in the pull-down driving control signal CTR_PD, is changed using a metal option mask.

The pull-down main driving unit 160 performs a pull-down operation on the output terminal DOUT in response to the output signal of the pull-down metal option unit 150, and includes an NMOS transistor having a source and a drain connected between the ground voltage terminal VSS and the output terminal DOUT, and a gate receiving an output signal of the pull-down metal option unit 150.

Meanwhile, a third resistance R3 between the pull-up main driving unit 130 and the output terminal DOUT, and a fourth resistance R4 between the output terminal DOUT and the pull-down main driving unit 160 may be provided in order to output data from the output terminal DOUT more stably.

An operation of the output driver will be described briefly.

First, when the pull-up data signal DAT_PU becomes logic the 'high', the pull-up driving control signal CTR_PU becomes the logic 'low'. Skew of the pull-up driving control signal CTR_PU is changed in accordance with the metal option mask of the pull-up metal option unit 120. The output signal of the pull-up metal option unit 120 turns on the PMOS transistor of the pull-up main driving unit 130. The pull-up operation is performed on the output terminal DOUT, and a logic 'high' signal is output through the output terminal DOUT.

When the pull-down data signal DAT_PD becomes the logic 'low', the pull-down driving control signal CTR_PD becomes the logic 'high'. Skew of the pull-down driving control signal CTR_PD is changed in accordance with the metal option mask of the pull-down metal option unit 150, and the output signal of the pull-down metal option unit 150 turns on the NMOS transistor of the pull-down main driving unit 160. The pull-down operation is performed on the output terminal DOUT, and a logic 'low' signal is output through the output terminal DOUT.

As described above, the conventional output driver changes the skew of the pull-up driving control signal CTR_PU and the pull-down driving control signal CTR_PD using metal option masks. Therefore, more switches are provided to change the pull-up driving control signal CTR_PU and the pull-down driving control signal CTR_PD in accordance with variable skew. However, because a switch used in a metal option mask occupies a relatively large area, there is a limitation in increasing the number of the switches. Accordingly, the number of switches variable in accordance with skew should be limited, which means that the pull-up driving control signal CTR_PU and the pull-down driving control signal CTR_PD can not be variably secured by the conventional output driver.

Also, the pull-up metal option unit 120 and the pull-down metal option unit 150 have a constant resistance. Therefore, when, against expectation, skew occurs in the pull-up driving control signal CTR_PU and the pull-down driving control signal CTR_PD after the metal option mask, the desired pull-up and pull-down driving control signals CTR_PU and CTR_PD may not be secured.

The conventional output driver controls the slew rate of the pull-up driving control signal CTR_PU and the pull-down driving control signal CTR_PD by controlling the pull-up metal option unit 120 and the pull-down metal option unit 150. Thus, the pull-up main driving unit 130 and the pull-down main driving unit 160 are driven to control the slew rate of the output terminal DOUT. That is, in the conventional output driver, the full-up slew rate by which data is transited from the logic 'low' to the logic 'high' by the pull-up driving control signal CTR_PU is determined, and the full-down slew rate by which data is transited from the logic 'high' to the logic 'low' by the pull-down driving control signal CTR_PU is determined. That is, in the conventional output driver, the slew rates of the pull-up driving control signal CTR_PU and the pull-down driving control signal CTR_PD are in connection with the slew rate of the output terminal DOUT. However, the output driver with such a structure offers a narrow range of control for the slew rate of the pull-up driving control signal CTR_PU and the pull-down driving control signal CTR_PD.

As the operating frequency of the semiconductor memory device increases, the pull-up driving control signal CTR_PU and the pull-down driving control signal CTR_PD may not make a full swing in such a structure as in the conventional output driver. In such circumstances, the output driver is weakened especially against power noises and changes in accordance with PVT.

As described above, when the pull-up driving control signal CTR_PU and the pull-down driving control signal CTR_PD do not achieve a target slew rate, data output from the output terminal OUT also may accordingly have an undesirable slew rate.

That is, the data should be output in synchronization with the rising edge and the falling edge of the external clock signal, while the external clock signal is applied to the semiconductor memory device with an approximate duty rate of 50:50. Ideally, data should be output in accordance with the duty rate of the external clock signal. However, if the pull-up driving control signal CTR_PU and the pull-down driving control signal CTR_PD are not secured, the pull-up main driving unit 130 and the pull-down main driving unit 160 which operate in connection therewith may not output desired data. That is, data may not be output in accordance with the duty rate of the external clock signal. This lowers the reliability and the accuracy of the semiconductor memory device.

SUMMARY OF THE INVENTION

Embodiments of the present invention are directed to providing an output driver capable of outputting data with a desired slew rate by additionally driving an output terminal in response to data input into the output terminal.

In accordance with an aspect of the present invention, there is provided an output driver, which includes a pre-driver configured to generate a main driving control signal in response to a data signal, a main driver configured to drive an output terminal in response to the main driving control signal, an auxiliary driving control signal generator configured to generate an auxiliary driving control signal having an activation interval corresponding to the data signal and an interval control signal, and an auxiliary driver configured to drive the output terminal in response to the auxiliary driving control signal.

In accordance with another aspect of the present invention, there is an output driver, which includes a pull-up and a pull-down pre-driver configured to generate a pull-up main driving control signal and a pull-down main driving control signal in response to a data signal, a main driver configured to drive an output terminal in response to the pull-up and the pull-down main driving control signals, a pull-up and pull-down auxiliary driving control signal generator configured to generate a pull-up auxiliary driving control signal and a pull-down auxiliary driving control signal, each having an activation interval corresponding to the data signal and respective pull-up and pull-down interval control signals, and an auxiliary driver configured to drive the output terminal in response to the pull-up and the pull-down auxiliary driving control signals.

In accordance with another aspect of the present invention, there is a provided an output driver, which includes: a pre-driver configured to generate a main driving control signal in response to a data signal, a main driver configured to drive an output terminal in response to the main driving control signal, a plurality of pull-up auxiliary driving control signal generators configured to generate a plurality of pull-up auxiliary driving control signals having an activation interval corresponding to the data signal and a pull-up interval control signal, a plurality of pull-down auxiliary driving control signal generators configured to generate a plurality of pull-down auxiliary driving control signals having an activation interval corresponding to the data signal and a pull-down interval control signal, and a plurality of auxiliary drivers configured to drive the output terminal in response to the plurality of pull-up and pull-down auxiliary driving control signals.

Recently, the various methods are applied to the output driver in order to control the slew rate of the pull-up and pull-down driving control signals. However, the limitation in increasing a chip area has been accompanied with these applications. In particular, as operation speed of the recent semiconductor memory device gets higher, the pull-up and pull-down driving control signals may not make a full swing. The existing output driver having such a shortcoming appears very weak in power noises or PVT conditions. Because an output terminal is additionally driven in accordance with the data input into the output driver, it is possible to control the slew rate of the data output from the output terminal only if it is designed so that the pull-up and pull-down driving control signals may make the full swing stably. To this end, an embodiment of the present invention employs a method of changing the current driving power of the output terminal when the logic level of the input data changes. Therefore, the output driver in accordance with an embodiment of the present invention may output data securing a desired slew rate. This means that the data can be output in accordance with the duty rate of the external clock signal. Accordingly, it is possible to increase the reliability and an accuracy of the semiconductor memory device.

DESCRIPTION OF SPECIFIC EMBODIMENTS

Hereinafter, an output driver in accordance with an embodiment of the present invention will be described in detail with reference to the accompanying drawings.

Figure 1:
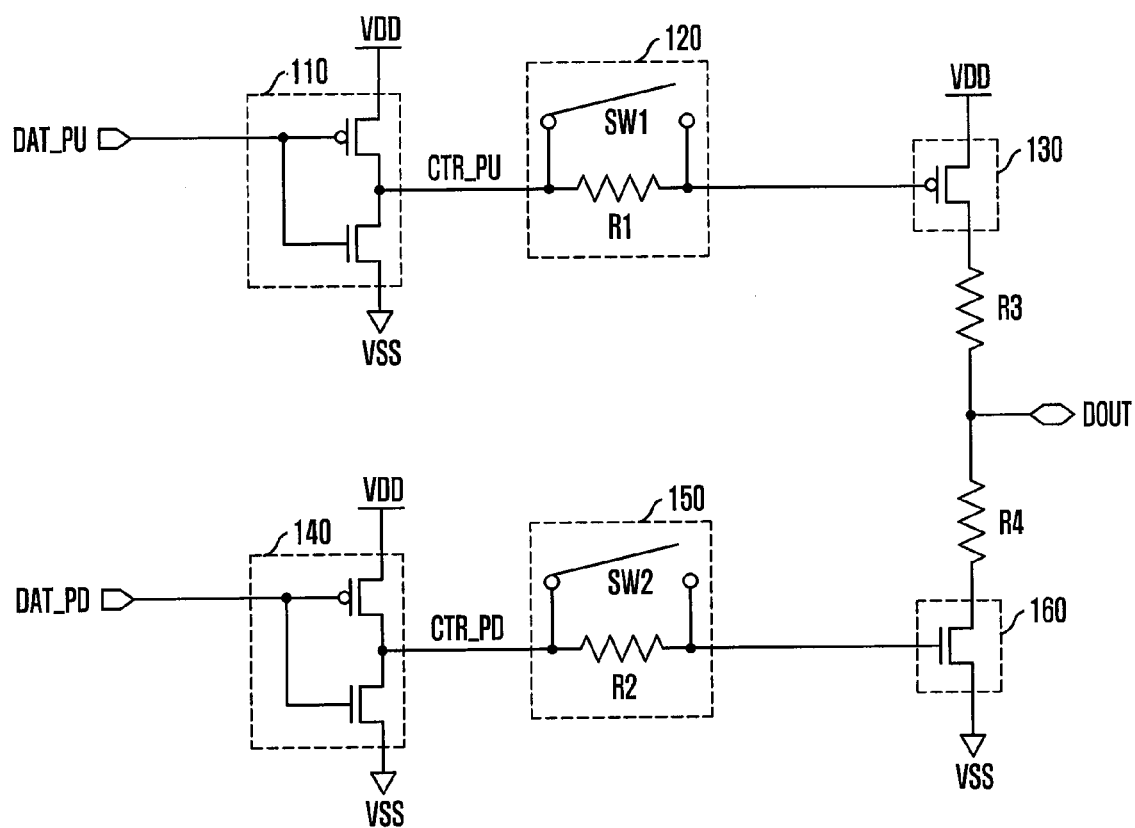
FIG. 1 is a circuit diagram illustrating a conventional output driver.
Figure 2:
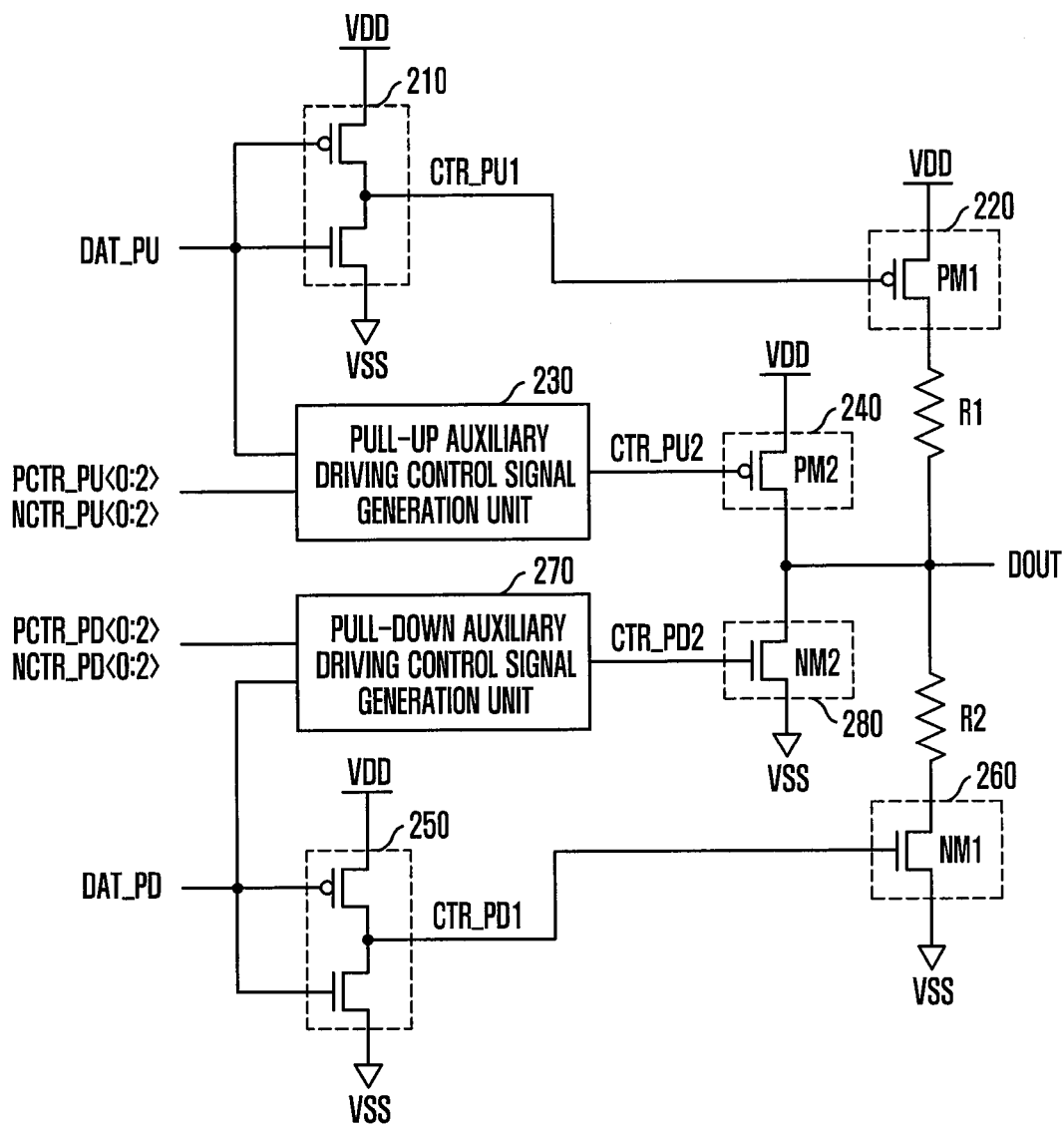
FIG. 2 is a circuit diagram illustrating an output driver in accordance with an embodiment of the present invention.

FIG. 2 is a circuit diagram illustrating an output driver in accordance with an embodiment of the present invention.

Referring to FIG. 2, the output driver includes a pull-up pre-driving unit 210, a pull-up main driving unit 220, a pull-up auxiliary driving control signal generation unit 230, a pull-up auxiliary driving unit 240, a pull-down pre-driving unit 250, a pull-down main driving unit 260, a pull-down auxiliary driving control signal generation unit 270, and a pull-down auxiliary driving unit 280.

The pull-up pre-driving unit 210 generates a pull-up main driving control signal CTR_PU1 in response to a pull-up data signal DAT_PU, and includes a PMOS transistor and an NMOS transistor, which are series-connected between an external voltage terminal VDD and a ground voltage terminal VSS and each receive the pull-up data signal DAT_PU through their respective gates.

The pull-up main driving unit 220 performs a pull-up operation on an output terminal DOUT in response to the pull-up main driving control signal CTR_PU1, and includes a first PMOS transistor PM1 having source and drain connected between the external voltage terminal VDD and the output terminal DOUT, and a gate receiving the pull-up main driving control signal CTR_PU1.

The pull-up auxiliary driving control signal generation unit 230 generates a pull-up auxiliary driving control signal CTR_PU2 having an activation interval corresponding to the pull-up data signal DAT_PU and pull-up interval control signals PCTR_PU<0:2>, NCTR_PU<0:2>. Here, the pull-up interval control signals PCTR<0:2>, NCTR_PU<0:2>may have voltage levels in correspondence with signals provided from a mode register set or external/internal test signals.

The pull-up auxiliary driving unit 240 performs an additional pull-up operation on the output terminal DOUT in response to the pull-up auxiliary driving control signal CTR_PU2, and includes a second PMOS transistor PM2 having a source and a drain connected between the external voltage terminal VDD and the output terminal DOUT, and a gate receiving the pull-up auxiliary driving control signal CTR_PU2.

The pull-down pre-driving unit 250 generates the pull-down main driving control signal CTR_PD1 in response to a pull-down data signal DAT_PD, and includes a PMOS transistor and an NMOS transistor which are series-connected between the external voltage terminal VDD and the ground voltage terminal VSS, and each receive the pull-down data signal DAT_PD through their respective gates.

The pull-down main driving unit 260 performs a pull-down operation on the output terminal DOUT in response to the pull-down main driving control signal CTR_PD1, and includes a first NMOS transistor NM1 having a source and a drain connected between the output terminal DOUT and the ground voltage terminal VSS, and a gate receiving the pull-down main driving control signal CTR_PD1.

The pull-down auxiliary driving control signal generation unit 270 generates a pull-down auxiliary driving control signal CTR_PD2 having an activation interval corresponding to the pull-down data signal DAT_PD and pull-down interval control signals PCTR_PD<0:2>, NCTR_PD<0:2>. Here, the pull-down interval control signals PCTR_PD<0:2>, NCTR_PD<0:2>may have voltage levels corresponding to signals provided from a mode register set or external/internal test signals.

The pull-down auxiliary driving unit 280 performs the pull-down operation on the output terminal DOUT in response to a pull-down auxiliary driving control signal CTR_PD2, and includes a second NMOS transistor NM2 having a source and a drain connected between the output terminal DOUT and the ground voltage terminal VSS, and a gate receiving the pull-down auxiliary driving control signal CTR_PD2.

Meanwhile, a first resistance R1 may be provided between the pull-up main driving unit 220 and the output terminal DOUT, and a second resistance R2 may be provided between the output terminal DOUT and the pull-down main driving unit 260 in order to output data provided from the output terminal DOUT more stably. Also, the pull-up data signal DAT_PU and the pull-down data signal DAT_PD may be synchronized with the internal clock signal.

As compared with the conventional output driver, the an output driver in accordance with the above embodiment of the present invention includes a pull-up auxiliary driving control signal generation unit 230, a pull-up auxiliary driving unit 240 and a pull-down auxiliary driving control signal generation unit 270, and a pull-down auxiliary driving unit 280 to control the slew rate of data to be output, while reducing the area used.

An operation of the output driver will be described briefly.

First, when the pull-up data signal DAT_PU becomes the logic 'high', the pull-up driving control signal CTR_PU becomes the logic 'low'. The pull-up main driving control signal CTR_PU1 turns on the first PMOS transistor PM1 of the pull-up main driving unit 220 so as to perform the pull-up operation on the output terminal DOUT. In this case, the pull-up auxiliary driving control signal generation unit 230 generates the pull-up auxiliary driving control signal CTR_PU2 having an activation interval corresponding to the pull-up data signal DAT_PU and the pull-up interval control signals PCTR_PU<0:2>and NCTR_PU<0:2>. Therefore, the pull-up auxiliary driving control signal CTR_PU2 turns on the second PMOS transistor PM2 of the pull-up auxiliary driving unit 240 so as to perform a pull-up operation on the output terminal DOUT.

Next, if the pull-down data signal DAT_PD becomes the logic 'low', the pull-down main driving control signal CTR_PD1 becomes the logic 'high'. The pull-down main driving control signal CTR_PD1 turns on the first NMOS transistor NM1 of the pull-down main driving unit 260 so as to perform the pull-down operation on the output terminal DOUT. In this case, the pull-down auxiliary driving control signal generation unit 270 generates the pull-down auxiliary driving control signal CTR_PD2 having the activation interval corresponding to the pull-down data signal DAT_PD and the pull-down interval control signal PCTR_PD<0:2>and NCTR_PD<0:2>. Therefore, the pull-down auxiliary driving control signal CTR_PD2 turns on the second NMOS transistor NM2 of the pull-down auxiliary driving unit 240 so as to perform the pull-down operation on the output terminal DOUT.

Figure 3:
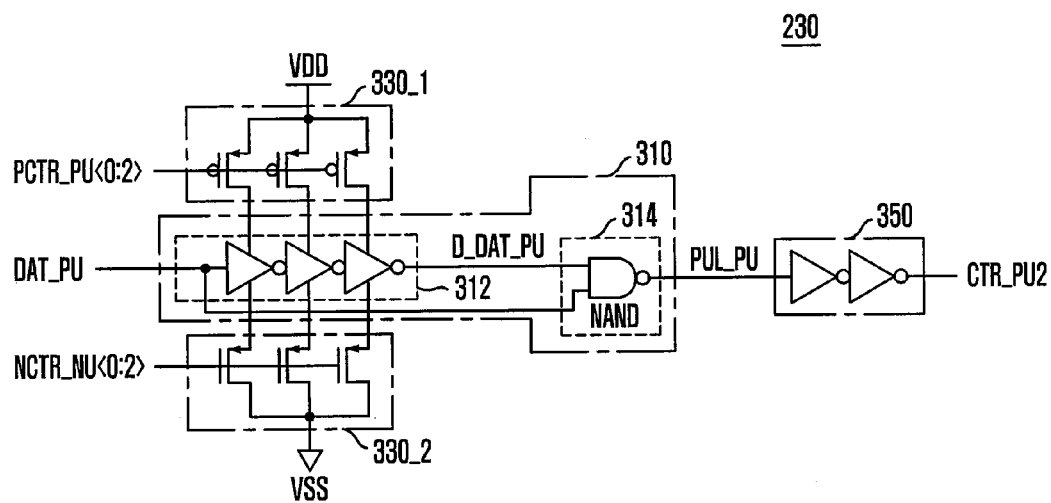
FIG. 3 is a circuit diagram illustrating a pull-up auxiliary driving control signal generation unit 230 in FIG. 2.

FIG. 3 is a circuit diagram illustrating a pull-up auxiliary driving control signal generation unit 230 in FIG. 2.

Referring to FIG. 3, the pull-up auxiliary driving control signal generation unit 230 includes a pull-up pulse signal generation unit 310, pull-up pulse control units 330_1 and 330_2, and a pull-up auxiliary driving control signal output unit 350.

The pull-up pulse signal generation unit 310 generates a pull-up pulse signal PUL_PU in response to the pull-up data signal DAT_PU, and includes a pull-up delay unit 312 to delay the pull-up data signal DAT_PU, and a pull-up pulse signal output unit 314 to output the pull-up pulse signal PUL_PU in response to an output signal D_DAT_PU of the pull-up delay unit 312 and the pull-up data signal DAT_PU.

The pull-up delay unit 312 delays the pull-up data signal DAT_PU for a delay time corresponding to the pull-up interval control signals PCTR_PU<0:2>and NCTR_PU<0:2>, and includes a plurality of inverters. The pull-up pulse signal output unit 314 includes a NAND gate NAND to receive the output signal D_DAT_PU of the pull-up delay unit 312 and the pull-up data signal DAT_PU, and outputs the pull-up pulse signal PUL_PU.

Meanwhile, the pull-up pulse control units 330_1 and 330_2 control a pulse width of the pull-up pulse signal PUL_PU in response to the pull-up interval control signals PCTR_PU<0:2>and NCTR_PU<0:2>, and provide the pull-up delay unit 312 with a driving current corresponding to the pull-up interval control signals PCTR_PU<0:2>and NCTR_PU<0:2>by being inserted on a path of a driving current for the pull-up delay unit 312.

In accordance with an embodiment of the present invention, the pull-up delay unit 312 increases or reduces the delay time of the pull-up data signal DAT_PU in accordance with the pull-up interval control signal PCTR_PU<0:2>and NCTR_PU<0:2>. The delay time by which the pull-up delay unit 312 delays the pull-up data signal DAT_PU determines the pulse width of the pull-up pulse signal PUL_PU.

Meanwhile, the pull-up auxiliary driving control signal output unit 350 receives the pull-up pulse signal PUL_PU, of which the pulse width is controlled as described above, to generate the pull-up auxiliary driving control signal CTR_PU2. The pull-up auxiliary driving control signal CTR_PU2 is a signal corresponding to the pull-up pulse signal PUL_PU. The pull-up auxiliary driving control signal output unit 350 in accordance with an embodiment of the present invention outputs the pull-up auxiliary driving control signal CTR_PU2 corresponding to the pull-up pulse signal PUL_PU of which the pulse width is controlled by the pull-up pulse control units 330_1 and 330_2. The pulse width of the pull-up auxiliary driving control signal CTR_PU2 is proportional to the time in which the pull-up auxiliary driving unit 240 performs the pull-up operation on the output terminal DOUT.

Figure 4:
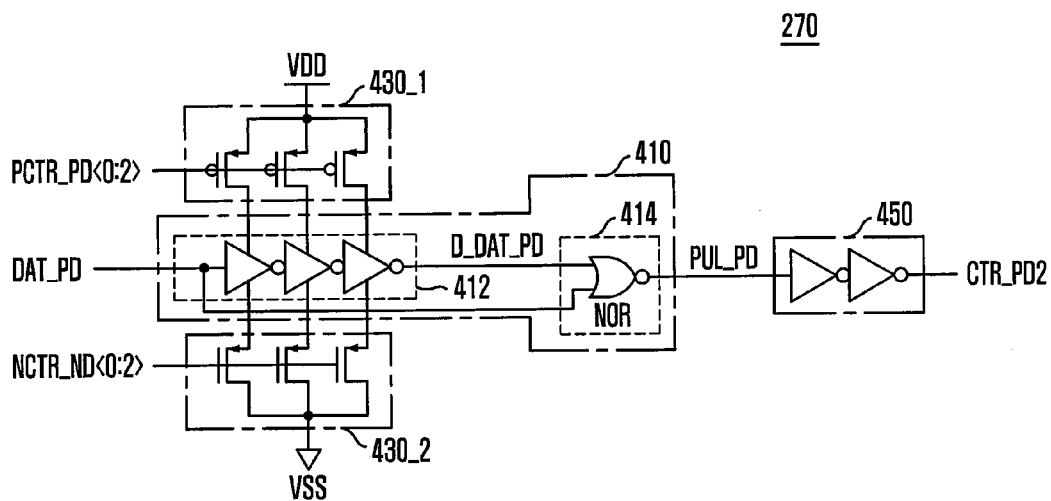
FIG. 4 the circuit diagram illustrating a pull-down auxiliary driving control signal generation unit 270 in FIG. 2.

FIG. 4 the circuit diagram illustrating a pull-down auxiliary driving control signal generation unit 270 in FIG. 2.

Referring to FIG. 4, the pull-down auxiliary driving control signal generation unit 270 includes a pull-down pulse signal generation unit 410, pull-down pulse control units 430_1 and 430_2, and a pull-down auxiliary driving control signal output unit 450.

The pull-down pulse signal generation unit 410 generates a pull-down pulse signal PUL_PD in response to a pull-down data signal DAT_PD, and includes a pull-down delay unit 412 to delay the pull-down data signal DAT_PD and a pull-down pulse signal output unit 414 to output the pull-down pulse signal PUL_PD in response to an output signal D_DAT_PD of the pull-down delay unit 412 and the pull-down data signal DAT_PD.

The pull-down delay unit 412 delays the pull-down data signal DAT_PD for a delay time corresponding to the pull-down interval control signals PCTR_PD<0:2>and NCTR_PD<0:2>, and includes a plurality of inverters. The pull-down pulse signal output unit 414 includes a NOR gate NOR to receive the output signal D_DAT_PD of the pull-down delay unit 412 and the pull-down data signal DAT_PD and outputs a pull-down pulse signal PUL_PD.

Meanwhile, the pull-down pulse control unit 430_1 and 430_2 control a pulse width of the pull-down pulse signal PUL_PD in response to the pull-down interval control signals PCTR_PD<0:2>and NCTR_PD<0:2>, and provide the pull-down delay unit 412 with a driving current corresponding to the pull-down interval control signals PCTR_PD<0:2>and NCTR_PD<0:2>by being inserted on a path of a driving current for the pull-down delay unit 412.

In accordance with an embodiment of the present invention, the pull-down delay unit 412 increases or reduces the delay time of the pull-up data signal DAT_PD in accordance with the pull-down interval control signal PCTR_PD<0:2>and NCTR_PD<0:2>. The delay time by which the pull-down delay unit 412 delays the pull-down data signal DAT_PD determines the pulse width of the pull-down pulse signal PUL_PD.

Meanwhile, the pull-down auxiliary driving control signal output unit 450 receives the pull-down pulse signal PUL_PD, of which the pulse width is controlled as described above, to generate the pull-down auxiliary driving control signal CTR_PD2. Here, the pull-down auxiliary driving control signal CTR_PD2 is a signal corresponding to the pull-down pulse signal PUL_PD. The pull-down auxiliary driving control signal output unit 450 in accordance with an embodiment of the present invention outputs the pull-down auxiliary driving control signal CTR_PD2 corresponding to the pull-down pulse signal PUL_PD of which the pulse width is controlled by the pull-down pulse control units 430_1 and 430_2. The pulse width of the pull-down auxiliary driving control signal CTR_PD2 is proportional to the time in which the pull-down auxiliary driving unit 280 performs the pull-down operation on the output terminal DOUT.

Figure 5:
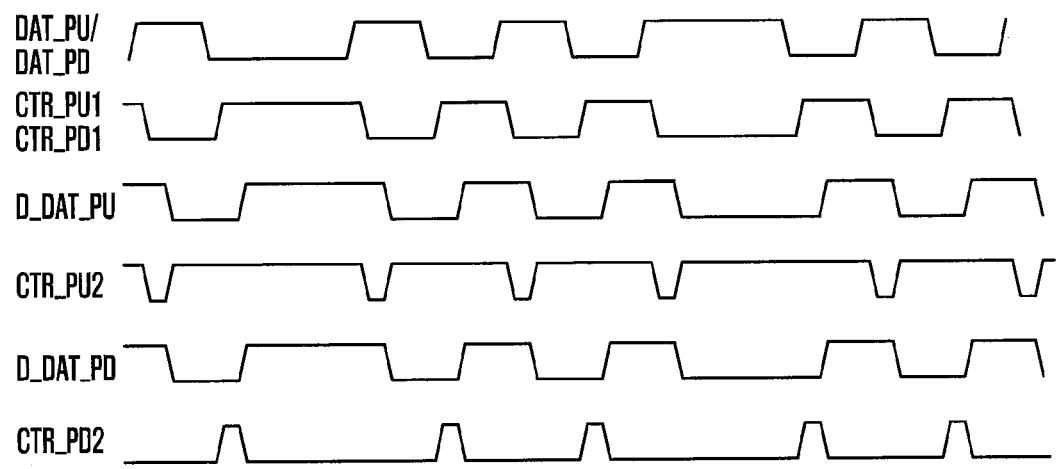
FIG. 5 is a timing diagram illustrating a timing of signals in FIGS. 2 to 4.

FIG. 5 is a timing diagram illustrating timings of signals illustrated in FIGS. 2 to 4. Timings for the pull-up and pull-down data signals DAT_PU and DAT_PD, the pull-up and pull-down main driving control signals CTR_PU1 and CTR_PD1, the output signal D_DAT_PU of the pull-up delay unit 312, the pull-up auxiliary driving control signal CTR_PU2, the output signal D_DAT_PD of the pull-down delay unit 412, and the pull-down auxiliary driving control signal CTR_PD2 are illustrated in FIG. 5.

For convenience of explanation, the pull-up and pull-down data DAT_PU and DAT_PD are illustrated with a single waveform because they may be considered as one data signal. The pull-up and pull-down main driving control signals CTR_PUL and CTR_PD1 also are illustrated with a single waveform.

Referring to FIGS. 3 to 5, the pull-up and pull-down main driving control signals CTR_PU1 and CTR_PD1 are activated to their corresponding logic levels in response to the pull-up and pull-down data signals DAT_PU and DAT_PD. Meanwhile, the pull-up and pull-down data signals DAT_PU and DAT_PD are input to the pull-up delay unit 312 and pull-down delay unit 314 to be delayed. The delay time is determined in accordance with the pull-up interval control signals PCTR_PU<0:2>and NCTR_PU<0:2>and the pull-down interval control signals PCTR_PD<0:2>and NCTR_PD<0:2>.

The pull-up auxiliary driving control signal CTR_PU2 is generated in response to the output signal D_DAT_PU of the pull-up delay unit 312 and the pull-up data signal DAT_PU. The pull-down auxiliary driving control signal CTR_PD2 is generated in response to the output signal D_DAT_PD of the pull-down delay unit 412 and the pull-down data signal DAT_PD. The second PMOS transistor PM2 of the pull-up auxiliary driving unit 240 performs an additional pull-up operation on the output terminal DOUT in response to the pull-up auxiliary driving control signal CTR_PU2. The second NMOS transistor NM2 of the pull-down auxiliary driving unit 380 performs an additional pull-down operation on the output terminal DOUT in response to the pull-down auxiliary driving control signal CTR_PD2.

The pull-up auxiliary driving control signal CTR_PU2 in accordance with an embodiment of the present invention may be activated to the logic 'low' during an initial activation interval of the pull-up main driving control signal CTR_PU. Also, the pull-down auxiliary driving control signal CTR_PD2 may be activated to the logic 'high' during an initial activation interval of the pull-down main driving control signal CTR_PD. That is, the pull-up and pull-down auxiliary driving control signals CTR_PU2 and CTR_PD2 may be activated to a corresponding logic level during the initial activation interval when the logic level of the input data changes, e.g., when the pull-up main driving control signal CTR_PUL or the pull-down main driving control signal CTR_PD1 is activated.

Finally, during the initial activation interval of the pull-up main driving control signal CTR_PU1, the pull-up operation may be performed by the pull-up main driving control signal CTR_PU1 and the pull-up auxiliary driving control signal CTR_PU2 in the output terminal DOUT. Also, during the initial activation interval of the pull-down main driving control signal CTR_PD1, the pull-down operation may be performed by the pull-down main driving control signal CTR_PD1 and the pull-down auxiliary driving control signal CTR_PD2 in the output terminal DOUT. The interval activation interval may change in accordance with a design. The above output driver in accordance with an embodiment of the present invention controls the current driving power of the output terminal DOUT by activating the pull-up and pull-down auxiliary driving control signals CTR_PU2 and CTR_PD2 during the initial activation interval of the pull-up and pull-down main driving control signals CTR_PUL and CTR_PD1. This allows the slew rate of the data to be output to be controlled.

Figure 6:
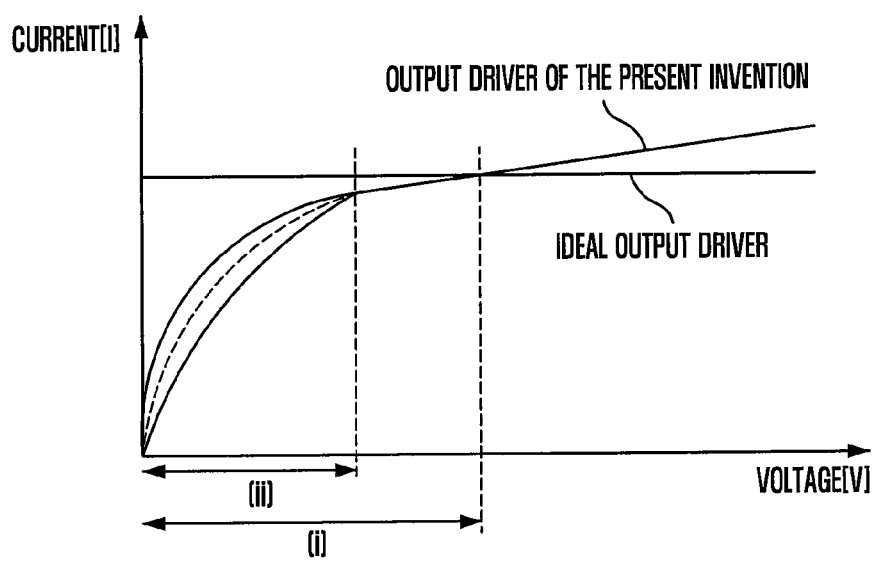
FIG. 6 is a graph illustrating voltage [V]-current [I] change of an output terminal of an output driver in accordance with an embodiment of the present invention.

FIG. 6 is a graph illustrating voltage [V]-current [I] change of an output terminal DOUT of an output driver in accordance with an embodiment of the present invention. A voltage-current change of an ideal output driver and a voltage-current change of an output driver in accordance with an embodiment of the present invention are shown. For convenience of explanation, the first and the second resistances R1 and R2 illustrated in FIG. 2 will be ignored.

In the ideal output driver, because, on turning-on, a first PMOS transistor PM1 and a first NMOS transistor NM1 have a constant resistance, a constant current flows regardless of an output voltage. However, in an actual output driver, because the first PMOS transistor PM1 and the first NMOS transistor NM1 have different resistances on turning-on, the current in accordance with the voltage diverges from that of the ideal output driver.

An output driver in accordance with the embodiment of the present invention can assert control of the current in accordance with the voltage because the output driver drives the output terminal DOUT additionally. Here, (i) is a section in which a swing of the output terminal DOUT occurs, and (ii) is a section in which the driving current of the output terminal DOUT is controlled. (ii) may vary in accordance with pulse widths and the pull-up and down auxiliary driving units 240 and 280, and the designed size of the pull-up and pull-down auxiliary driving control signals CTR_PU2 and CTR_PD2.

Figure 7:
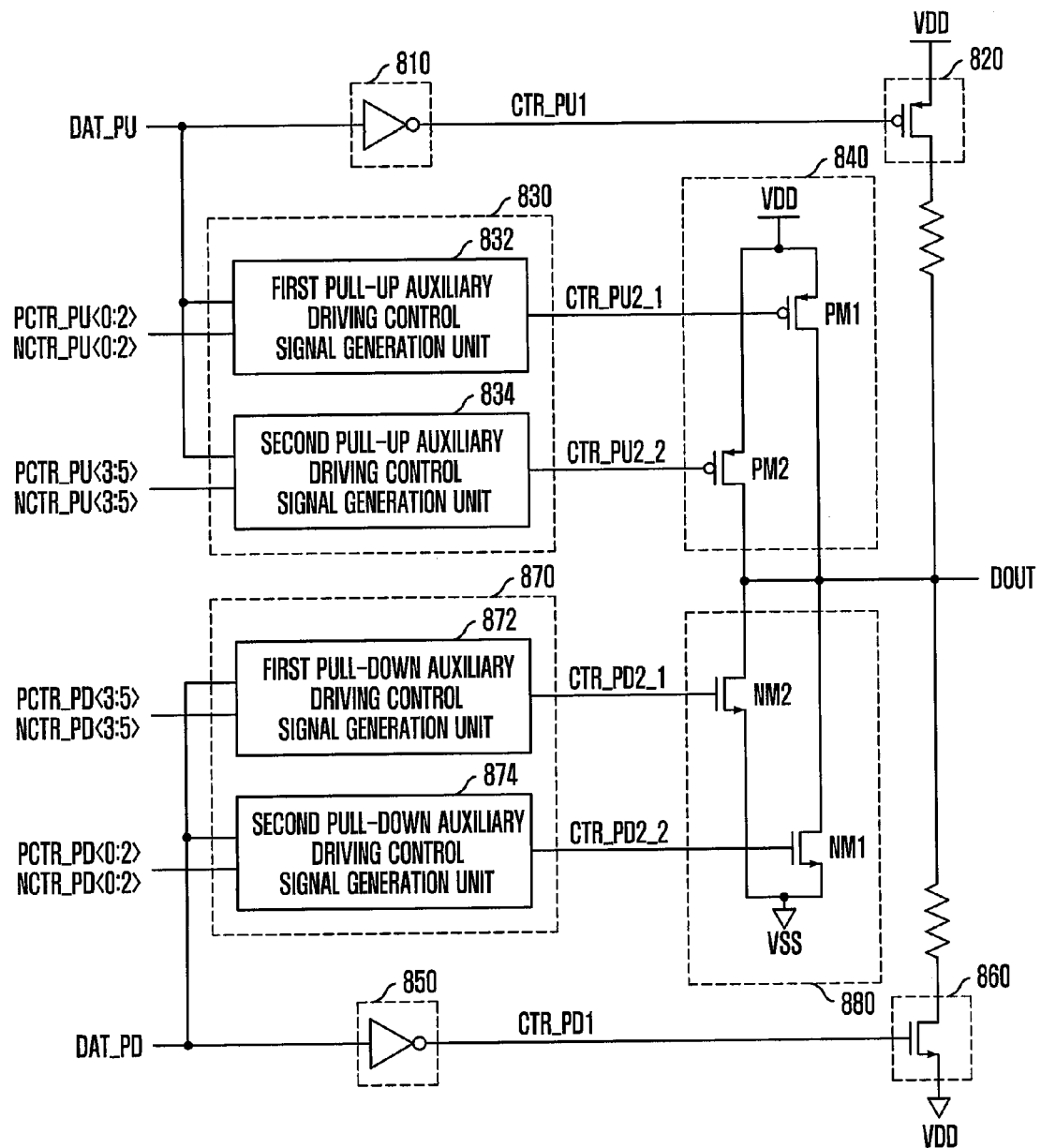
FIG. 7 is a circuit diagram illustrating an output driver in accordance with another embodiment of the present invention.

FIG. 7 is a circuit diagram illustrating an output driver in accordance with another embodiment of the present invention.

Referring to FIG. 7, the output driver includes a pull-up pre-driving unit 810, a pull-up main driving unit 820, a pull-up multiple auxiliary driving control signal generation unit 830, a pull-up multiple auxiliary driving unit 840, a pull-down pre-driving unit 850, a pull-down main driving unit 860 and a pull-down multiple auxiliary driving control signal generation unit 870, and pull-down multiple auxiliary driving unit 880. Hereinafter, descriptions of the pull-up pre-driving unit 810, the pull-up main driving unit 820, the pull-down pre-driving unit 850 and the pull-down main driving unit 860 will be omitted because they are identical to the pull-up pre-driving unit of 210, the pull-up main driving unit 220, the pull-down pre-driving unit 250 and the pull-down main driving unit 260 illustrated in FIG. 2, respectively.

Here, a first and a second pull-up auxiliary driving control signal generation units 832 and 834 respectively generate a first and a second pull-up auxiliary driving control signals CTR_PU2_1 and CTR_PU2_2 in response to the pull-up interval control signals PCTR_PU<0:5>, NCTR_PU<0:5>. The first and the second pull-up auxiliary driving units PM1 and PM2 respectively perform additional pull-up operations on the output terminal DOUT in response to the first and the second pull-up auxiliary driving control signals CTR_PU2_1 and CTR_PU2_2.

Next, a first and a second pull-down auxiliary driving control signal generation units 872 and 874 respectively generate a first and a second pull-down auxiliary driving control signals CTR_PD2_1 and CTR_PD2_2 in response to the pull-down interval control signals PCTR_PD<0:5>, NCTR_PD<0:5>. The first and the second pull-down auxiliary driving units NM1 and NM2 respectively perform additional pull-down operations on the output terminal DOUT in response to the first and the second pull-down auxiliary driving control signals CTR_PD2_1 and CTR_PD2_2.

The output driver in accordance with the embodiment illustrated in FIG. 7 uses a greater number of pull-up interval control signals PCTR_PU<0:5>, NCTR_PU<0:5>and pull-down interval control signals PCTR_PD<0:5>, NCTR_PD<0:5>than in the embodiment of FIG. 2. Accordingly, the output driver includes pull-up and a pull-down multiple auxiliary driving control signal generation units 830 and 870, and pull-up and pull-down multiple auxiliary driving units 840 and 880. Therefore, the output driver in accordance with the embodiment in FIG. 7 may more variably secure operations than in the embodiment of FIG. 2.

Also, in the embodiment of FIG. 7, it is possible to use the pull-up interval control signals PCTR_PU<0:5>, NCTR_PU<0:5>and the pull-down interval control signals PCTR_PD<0:5>, NCTR_PD<0:5>to correspond to circuit operation state. For example, assuming pull-up interval control signals PCTR_PU<0:2>, NCTR_PU<0:2>are activated, and pull-up interval control signals PCTR_PU<3:5>, NCTR_PU<3:5>are inactivated, the output terminal DOUT is additionally pulled up by the first pull-up auxiliary driving unit PM1. The pull-up operation by the first pull-up auxiliary driving unit PM1 and the pull-up operation of the second pull-up auxiliary driving units PM2 may have different current driving power. This means that more varied operations are possible using the pulse width of the first and the second pull-up auxiliary driving control signal CTR_PU2_1 and CTR_PU2_2, and the number of the auxiliary driving units to be driven.

As described above, the output driver in accordance with an embodiment of the present invention can variably control the slew rate of data output through the output terminal by activating the pull-up and pull-down auxiliary driving control signals CTR_PU2 and CTR_PD2 in the activation interval of the pull-up and pull-down main driving control signals and CTR_PU1 and CTR_PD1.

Also, the output driver in accordance with the embodiments of the present invention can be embodied in a relatively small area because it does not use the conventional metal option mask solution.

Furthermore, output drivers in accordance with the embodiments of the present invention do not control the slew rate of the pull-up and pull-down main driving control signals as in the conventional output driver, but directly control the current driving power of the output terminal DOUT. Accordingly, with the pull-up and pull-down pre-driving units 210 and 250 it is possible to control the slew rate of data output through the output terminal DOUT if only pull-up and a pull-down main driving control signals CTR_PUL and CTR_PD1 are designed to make a full swing. In this way, if the slew rate of data is variably and stably secured, data can be output in accordance with the duty rate of the external clock signal, thereby increasing the reliability and the accuracy of the semiconductor memory device.

The output driver in accordance with an embodiment of the present invention can output stable data using a reduced area in comparison to conventional output drivers.

Also, an output driver in accordance with an exemplary embodiment can secure data to be output with a desired slew rate, assure the integrity of data, and increase the reliability and the accuracy of the semiconductor memory device.

While the technical sprit of the present invention has been described with reference to the preferred embodiments, it should be understood by those skilled in the art that various substitutions, variations and modifications may be made without departing from the spirit and scope of the invention as defined in the following claims.

For example, although three inverters are used as a delay unit 312 and 412 by way of example in the above embodiments, they may be substituted with a plurality of inverters or with any delay element of a different type. Also, although analog signals having a voltage level are illustrated as the interval control signals PCTR_PU<0:2>, NCTR_PU<0:2>, PCTR_PD<0:2>, NCTR_PD<0:2> to control delay units 312 and 412, they may be substituted with digital signals. When digital signals are used, it is desirable for the delay units 312 and 412 to be designed such that a delay value varies in accordance with the digital signals. Furthermore, the logic gates and transistors as illustrated in the above embodiments can be embodied into different locations and types in accordance with alternative polarities for the signals.

What is claimed is:

1. An output driver, comprising:
   a pre-driver configured to generate a main driving control signal in response to a data signal;
   a main driver configured to drive an output terminal in response to the main driving control signal;
   an auxiliary driving control signal generator configured to generate an auxiliary driving control signal having an activation interval corresponding to the data signal and an interval control signal; and
   an auxiliary driver configured to drive the output terminal in response to the auxiliary driving control signal,
   wherein the auxiliary driving control signal generator comprises a delay unit configured to delay the data signal by a delay amount which is varied according to the interval control signal, and generates the auxiliary driving control signal by combining the data signal and an output signal of the delay unit.

2. The output driver as recited in claim 1, wherein the auxiliary driving control signal generator comprises:
   a pulse signal generation unit configured to generate a pulse signal having a pulse width corresponding to the activation interval in response to the data signal;
   a pulse control unit configured to control the pulse width of the pulse signal in response to the interval control signal; and
   an auxiliary driving control signal output unit configured to receive a signal of which a pulse width is controlled by the pulse control unit and output the auxiliary driving control signal.

3. The output driver as recited in claim 2, wherein the pulse signal generation unit comprises:
   the delay unit configured to delay the data signal; and
   a pulse signal output unit configured to output the pulse signal in response to the data signal and the output signal of the delay unit.

4. The output driver as recited in claim 3, wherein the pulse control unit is inserted on a path of a driving current of the delay unit and provides the delay unit with a driving current corresponding to the interval control signal.

5. The output driver as recited in claim 1, wherein the interval control signal has a voltage level corresponding to a signal set on a mode register set or a test signal.

6. An output driver, comprising:
   a pull-up and a pull-down pre-driver configured to generate a pull-up main driving control signal and a pull-down main driving control signal in response to a data signal;
   a main driver configured to drive an output terminal in response to the pull-up and the pull-down main driving control signals;
   pull-up and pull-down auxiliary driving control signal generators configured to respectively generate a pull-up auxiliary driving control signal and a pull-down auxiliary driving control signal, wherein each of the pull-up auxiliary driving control signal and the pull-down auxiliary driving control signal has an activation interval corresponding to the data signal and corresponding to pull-up and pull-down interval control signals, respectively; and
   an auxiliary driver configured to drive the output terminal in response to the pull-up and the pull-down auxiliary driving control signals,
   wherein each of the pull-up and pull-down auxiliary driving control signal generators comprises a delay unit configured to delay the data signal by a delay amount which is varied according to the respective one of the pull-up and pull-down interval control signals, and generates the respective one of the pull-up and pull-down auxiliary driving control signals by combining the data signal and an output signal of the delay unit.

7. The output driver as recited in claim 6, wherein the pull-up auxiliary driving control signal generator comprises:
   a pull-up pulse signal generation unit configured to generate a pull-up pulse signal having a pulse width corresponding to the activation interval in response to the data signal;
   a pull-up pulse control unit configured to control the pulse width of the pull-up pulse signal in response to the pull-up interval control signal; and
   a pull-up auxiliary driving control signal output unit configured to receive a signal of which a pulse width is controlled by the pull-up pulse control unit and output the pull-up auxiliary driving control signal.

8. The output driver as recited in claim 7, wherein the pull-up pulse signal generation unit comprises:
   the delay unit configured to delay the data signal; and
   a pulse signal output unit configured to output the pull-up pulse signal in response to the data signal and the output signal of the delay unit.

9. The output driver as recited in claim 8, wherein the pull-up pulse control unit is inserted on a path of a driving current of the delay unit and provides the delay unit with a driving current corresponding to the pull-up interval control signal.

10. The output driver as recited in claim 8, wherein the delay unit of the pull-up pulse signal generation unit delays the data signal by a delay time corresponding to its respective interval control signal.

11. The output driver as recited in claim 6, wherein the pull-down auxiliary driving control signal generator comprises:
a pull-down pulse signal generation unit configured to generate a pull-down pulse signal having a pulse width corresponding to the activation interval in response to the data signal;
a pull-down pulse control unit configured to control the pulse width of the pull-down pulse signal in response to the pull-down interval control signal; and
a pull-down auxiliary driving control signal output unit configured to receive a signal of which a pulse width is controlled by the pull-down pulse control unit and output the pull-down auxiliary driving control signal.

12. The output driver as recited in claim 11, wherein the pull-down pulse signal generation unit comprises:
the delay unit configured to delay the data signal; and
a pulse signal output unit configured to output the pull-down pulse signal in response to the data signal and the output signal of the delay unit.

13. The output driver as recited in claim 12, wherein the pull-down pulse control unit is inserted on a path of a driving current of the delay unit and provides the delay unit with a driving current corresponding to the pull-down interval control signal.

14. The output driver as recited in claim 6, wherein the interval control signals have voltage levels corresponding to a signal set on a mode register set or a test signal.

15. The output driver as recited in claim 6, wherein the auxiliary driver comprises:
a pull-up auxiliary driving unit configured to pull-up the output terminal in response to the pull-up auxiliary driving control signal; and
a pull-down auxiliary driving unit configured to pull-down the output terminal in response to the pull-down auxiliary driving control signal.

16. The output driver as recited in claim 6, wherein the main driver comprises:
a pull-up main driving unit configured to pull-up the output terminal in response to the pull-up main driving control signal; and
a pull-down main driving unit configured to pull-down the output terminal in response to the pull-down main driving control signal.

17. An output driver, comprising:
a pre-driver configured to generate a main driving control signal in response to a data signal;
a main driver configured to drive an output terminal in response to the main driving control signal;
a plurality of pull-up auxiliary driving control signal generators configured to generate a plurality of pull-up auxiliary driving control signals having activation intervals corresponding to the data signal and corresponding to a plurality of pull-up interval control signals, respectively;
a plurality of pull-down auxiliary driving control signal generators configured to generate a plurality of pull-down auxiliary driving control signals having activation intervals corresponding to the data signal and corresponding to a plurality of pull-down interval control signals, respectively; and
a plurality of auxiliary drivers configured to drive the output terminal in response to the plurality of pull-up and pull-down auxiliary driving control signals,
wherein each of the pull-up auxiliary driving control signal generators comprises a first delay unit configured to delay the data signal by a delay amount which is varied according to the respective pull-up interval control signals, and generates the respective pull-up auxiliary driving control signals by combining the data signal and an output signal of the first delay unit, and
wherein each of the pull-down auxiliary driving control signal generators comprises a second delay unit configured to delay the data signal by a delay amount which is varied according to the respective pull-down interval control signals, and generates the pull-down auxiliary driving control signal by combining the data signal and an output signal of the second delay unit.

18. The output driver as recited in claim 17, wherein the pull-up and pull-down interval control signals have voltage levels corresponding to a signal set on a mode register set or a test signal.

19. The output driver as recited in claim 17, wherein the pull-up and pull-down interval control signals include an activation signal to operate at least one of the plurality of pull-up auxiliary driving control signal generators and an activation signal to operate at least one of the plurality of pull-down auxiliary driving control signal generators.

20. The output driver as recited in claim 17, wherein the plurality of auxiliary drivers comprises:
a plurality of pull-up auxiliary driving units configured to pull-up the output terminal in response to the plurality of pull-up auxiliary driving control signals; and
a plurality of pull-down auxiliary driving units configured to pull-down the output terminal in response to the plurality of pull-down auxiliary driving control signals.

* * * * *